(12) United States Patent
Mehta et al.

(10) Patent No.: US 11,404,105 B2
(45) Date of Patent: Aug. 2, 2022

(54) WRITE DISTURB REFRESH RATE REDUCTION USING WRITE HISTORY BUFFER

(71) Applicant: Intel Corporation, Santa Clara, CA (US)

(72) Inventors: Akanksha Mehta, Portland, OR (US); Benjamin Graniello, Chandler, AZ (US); Rakan Maddah, Portland, OR (US); Philip Hillier, Portland, OR (US); Richard P. Mangold, Forest Grove, OR (US); Prashant S. Damle, Portland, OR (US); Kunal A. Khochare, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/128,963

(22) Filed: Dec. 21, 2020

(65) Prior Publication Data

US 2021/0110862 A1   Apr. 15, 2021

(51) Int. Cl.
*G11C 11/40* (2006.01)
*G11C 11/408* (2006.01)
(Continued)

(52) U.S. Cl.
CPC ...... *G11C 11/4082* (2013.01); *G11C 11/4074* (2013.01); *G11C 11/4076* (2013.01); *G11C 11/4093* (2013.01); *G11C 15/04* (2013.01)

(58) Field of Classification Search
CPC ............ G11C 11/4082; G11C 11/4074; G11C 11/4076; G11C 11/4093
See application file for complete search history.

(56) References Cited

U.S. PATENT DOCUMENTS

| 10,553,278 B1 | 2/2020 | Narsale et al. |
| 2006/0020764 A1* | 1/2006 | Kim ................... G06F 13/1668 |
| | | 711/168 |

(Continued)

FOREIGN PATENT DOCUMENTS

JP   5247333 B2   7/2013

OTHER PUBLICATIONS

Extended European Search Report for Patent Application No. 21198633.6, dated Mar. 14, 2022, 14 pages.

(Continued)

*Primary Examiner* — Han Yang
(74) *Attorney, Agent, or Firm* — Compass IP Law, PC

(57) ABSTRACT

A write history buffer can prevent write disturb in memory, enabling a reduction in write disturb refresh rate and improvement in performance. A memory device can include circuitry to cause consecutive write commands to the same address to be spaced by an amount of time to reduce incidences of write disturb, and therefore reduce the required write disturb refresh rate and improve performance. In one example, a memory device receives multiple write commands to an address. In response to receipt of the multiple write commands, the first write command is sent to the memory and a timer is started. Subsequent write commands that are received after the first write command and before expiration of the timer are held in a buffer. After expiration of the timer, only the most recent of the subsequent write commands to the address is sent to the memory array. In this way, the subsequent write commands received during a time window after the first write command are coalesced and a single subsequent write command is sent to the memory.

20 Claims, 7 Drawing Sheets

(51) Int. Cl.
*G11C 11/4093* (2006.01)
*G11C 15/04* (2006.01)
*G11C 11/4076* (2006.01)
*G11C 11/4074* (2006.01)

(56) References Cited

U.S. PATENT DOCUMENTS

| | | | | |
|---|---|---|---|---|
| 2008/0307244 A1* | 12/2008 | Bertelsen | ............ | G06F 1/3203 |
| | | | | 713/323 |
| 2014/0063886 A1* | 3/2014 | Rodriguez | ............ | G11C 15/00 |
| | | | | 365/49.17 |
| 2018/0004410 A1* | 1/2018 | Madraswala | ........... | G06F 3/061 |

OTHER PUBLICATIONS

Hur, I et al., "Memory Scheduling for Modem Microprocessors," ACM Transactions on Computer Systems, vol. 25, No. 4, Article 10, Dec. 2007, 36 pages.

* cited by examiner

WRITE DISTURB REFRESH RATE REDUCTION USING WRITE HISTORY BUFFER

FIELD

The descriptions are generally related to memory, and more particularly, techniques for reducing write disturb refresh rate in memory.

BACKGROUND

Memory resources have innumerable applications in electronic devices and other computing environments. Demand for smaller, faster, lower power, and higher density memory has led to the development of new memory technologies. During the development of new memory technologies, a variety of challenges may be encountered such as challenges related to the manufacturing process, infrastructure, and reliability. For example, one challenge that may be encountered is the prevention or mitigation of write disturb in memory.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

In one example, a write history buffer can prevent write disturb in memory, enabling a reduction in write disturb refresh rate and improvement in performance.

Write disturb refers to an event in which a write to a memory cell disturbs one or more neighboring cells' state, which can lead to data loss. Write disturb can occur for a variety of reasons, depending on the memory technology. In crosspoint memory, write disturb can occur due to thermal crosstalk. When the writes to a memory cell occur within a short time from one another (e.g., when a memory location is "hammered"), heat from the cell being written can affect the state of neighboring cells. For example, thermal crosstalk can cause the state of the neighboring cells to change, resulting in the logic value represented by the state being changed or flipped.

To prevent loss of data due to write disturb, some internal memory controllers issue periodic write operations at a constant rate to neighboring cells of a cell being actively written to refresh and retain the neighboring cells' states. Although refresh operations can prevent data loss due to write disturb, the refresh operations can limit bandwidth and cause performance degradation. Increases in memory array density can further exacerbate thermal crosstalk, leading to further performance degradation. Furthermore, issuing refreshes at a constant rate to neighboring cells of a cell being hammered does not take into consideration the dependency of thermal stress on delay among writes, causing the refresh writes to be issued at a rate that assumes the worst thermal stress capability.

Figure 1A:
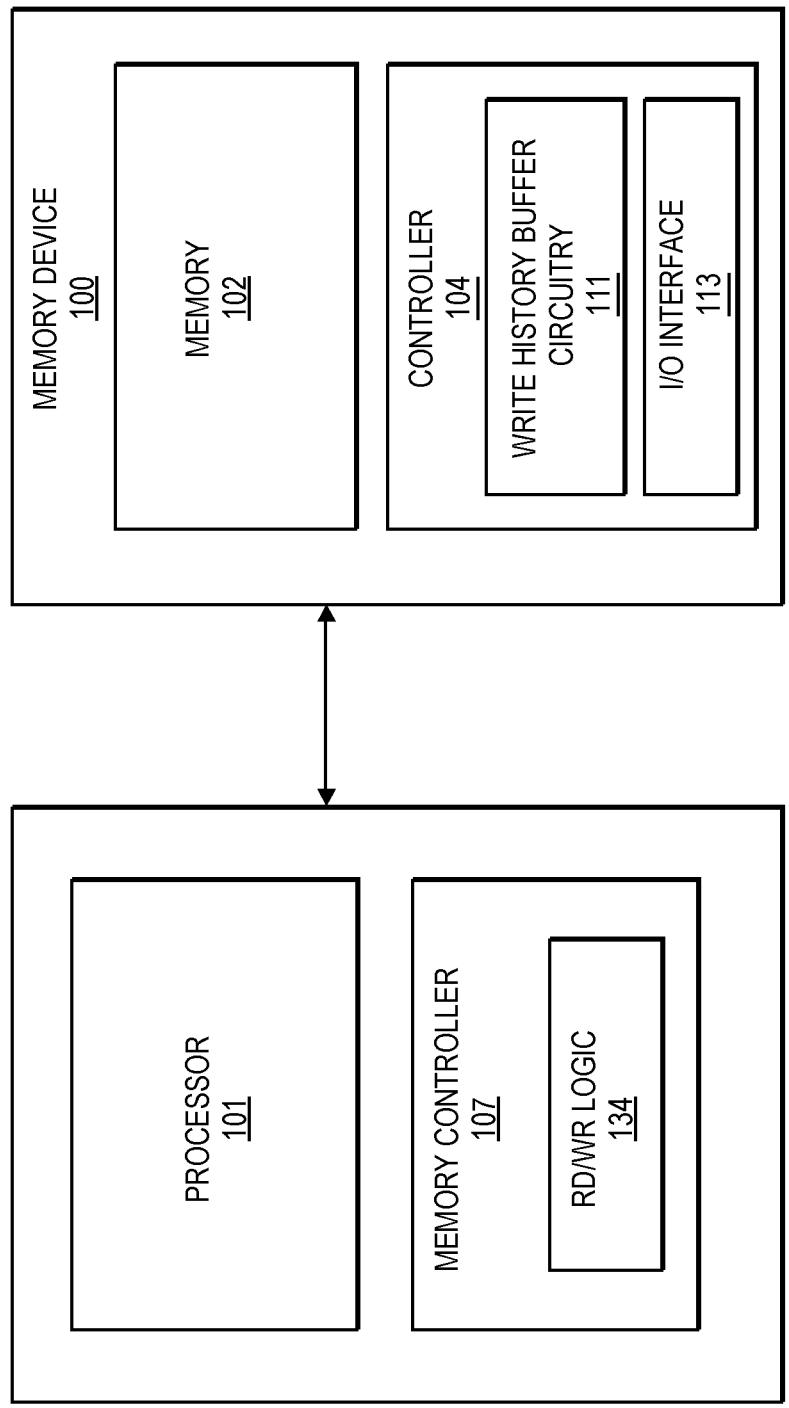
FIG. 1A is a block diagram of a system that include a non-volatile memory device with a write history buffer.

In contrast, a memory device can include circuitry to cause consecutive write commands to the same address to be spaced by an amount of time to reduce incidences of write disturb, and therefore reduce the required write disturb refresh rate and improve performance. In one example, a memory device receives multiple write commands to an address. In response to receipt of the multiple write commands, the first write command is sent to the memory and a timer is started. Subsequent write commands that are received after the first write command and before expiration of the timer are held in a buffer. After expiration of the timer, only the most recent of the subsequent write commands to the address is sent to the memory array. In this way, the subsequent write commands received during a time window after the first write command are coalesced and only a single subsequent write command is sent to the memory. FIG. 1A is a block diagram of a system that includes a non-volatile memory device with a write history buffer.

The system of FIG. 1A includes components of a memory subsystem having memory 102 to store and provide data in response to operations of processor 101. The system receives memory access requests from the processor 101, which is processing logic that executes operations based on data stored in memory 102 or generates data to store in memory 102. The processor 101 can be or include a host processor, central processing unit (CPU), microcontroller or microprocessor, graphics processor, peripheral processor, application specific processor, artificial intelligence (AI) or machine learning processor, an accelerator, or other processor, and can be single core or multicore.

The system includes a memory controller (e.g., host memory controller) 107, which represents logic to interface with the memory device 100 and manage access to data stored in the memory 102. In one example, the memory controller 107 is integrated into the hardware of the processor 101. In one example, the memory controller 107 is standalone hardware, separate from the processor 101. The memory controller 107 can be a separate circuit on a substrate that includes the processor. The memory controller 107 can be a separate die or chip integrated on a common substrate with a processor die (e.g., as a system on a chip (SoC)). In one example, the memory controller 107 is an integrated memory controller (iMC) integrated as a circuit on the processor die. In one example, the memory 102 can be included on an SoC with the memory controller 107 and/or the processor 101.

In the illustrated example, the memory controller 107 includes read/write logic 134, which includes hardware to interface with the memory device 100. The logic 134 enables the memory controller 107 to generate read and write commands to service requests for data access generated by the execution of instructions by processor 101.

The memory 102 represents memory resources for the system. The memory 102 includes one or more memory arrays of memory cells. The memory 102 may include volatile and/or nonvolatile memory. In one example, the memory 102 includes one or more of a crosspoint memory array, a phase change memory, or a persistent memory. The memory device 100 includes a controller 104, which typically includes control circuitry to control the memory device's internal operations to execute commands received from memory controller 107. The controller 104 can be, for example, on a same module (e.g., dual inline memory module (DIMM)), same package, and/or same die as the memory 102. In one example, the controller 104 is an application specific integrated circuit (ASIC) or other hardware circuitry. The controller 104 can control any of timing, voltage levels, addressing, I/O (input/output) margining, scheduling, and error correction for memory 102. Thus, the controller 104 includes I/O interface circuitry 113 to handle receipt and transmission of commands and data from the memory controller 107, and to control the access to the memory array. The I/O interface circuitry for controlling access to the memory array can include decode logic, including logic to address specific rows or columns, bit lines or word lines, or otherwise address specific bits of data. The controller 104 includes write history buffer circuitry 111, which can enable a reduction in write disturb, as explained in more detail below.

Figure 1B:
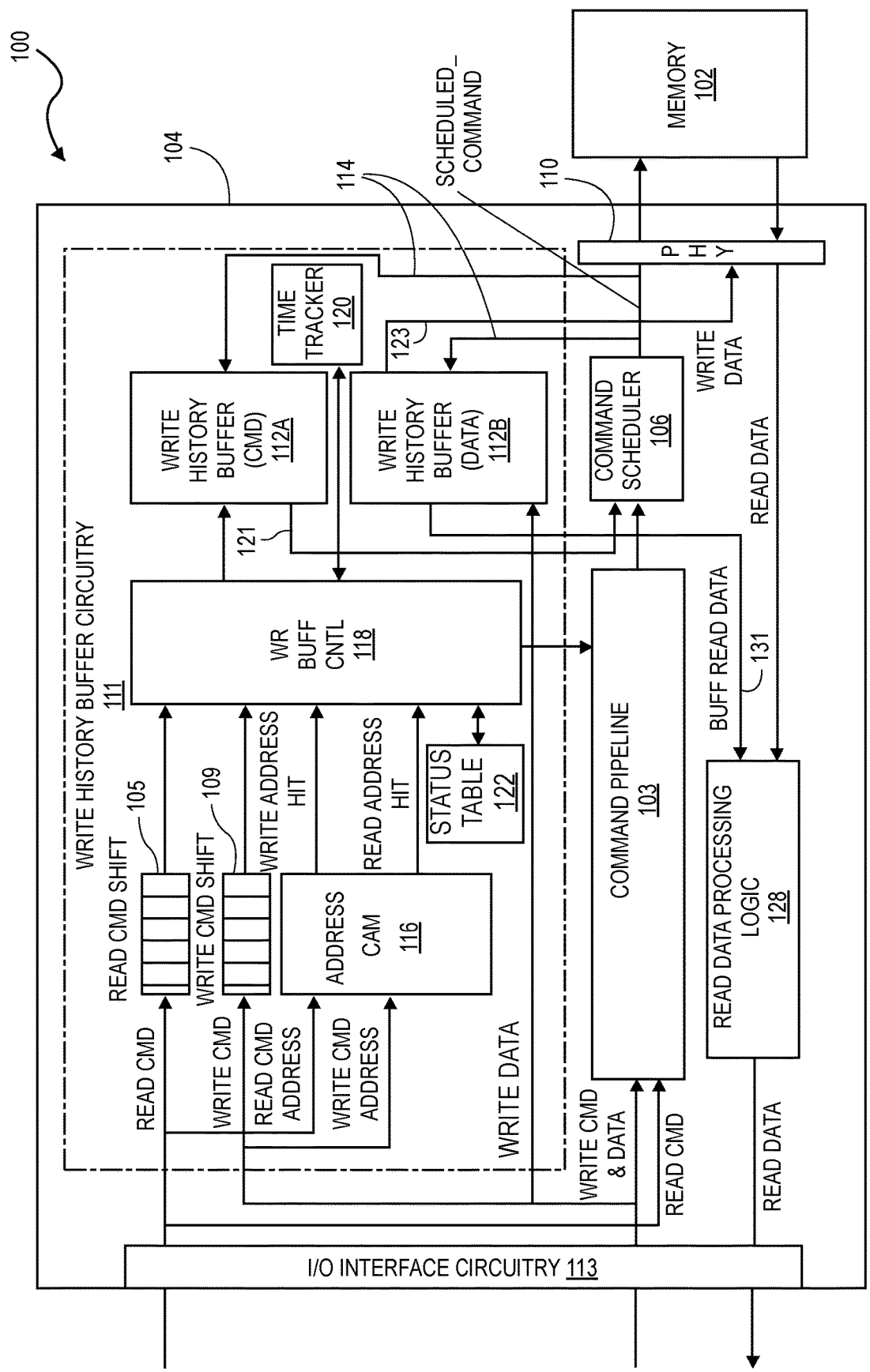
FIG. 1B illustrates an example of a memory device with a write history buffer.

FIG. 1B illustrates an example of a memory device with a write history buffer. Note that the memory device 100 of FIG. 1B is one example; other memory devices with write history buffers may include different or additional features than the example of FIG. 1B. For example, some blocks shown as separate may be combined (e.g., one or more of the write history command buffer, the write history data buffer, the memory to store write command addresses, the timers, and the status table may be combined).

Referring to FIG. 1B, the memory device 100 includes a memory 102 and a controller 104. As discussed above, the controller 104 includes hardware logic to control access to the memory. The hardware logic illustrated in FIG. 1B includes logic for receiving and handling commands. For example, the logic to receive and handle commands includes I/O interface circuitry 113 and a command pipeline or queue 103. The I/O interface circuitry 113 receives commands from a requester, such as a host. The command pipeline 103 includes circuitry to receive and hold commands (e.g., read commands, write commands, and/or other commands) until the commands can be scheduled to be sent to the memory. Commands are sent from the command pipeline 103 to the command scheduler 106. The command scheduler 106 schedules commands to be sent to the memory 102 via the physical layer (PHY) 110. If a read command is received and sent to the memory 102, read data is retrieved from the memory 102 and sent via the physical layer 110 to read data processing logic 128. The read data processing logic 128 processes and sends the read data to the requesting device (e.g., to a host memory controller).

Referring to FIG. 1B, consider an example of how a memory device without a write history buffer may handle receipt of a write command. In one such example, a write command is received by the command pipeline 103. The command pipeline 103 holds the received command. From the pipeline 103, the command goes to the command scheduler 106. The command scheduler 106 schedules the command to the memory 102. The command is sent to the crosspoint memory 102 via a physical layer 110. Similarly, a read command is received by the command pipeline 103, sent to the scheduler 106, and from there sent to the memory 102 via the physical layer 110. When the read data comes back from the memory, it is sent to the read data processing logic 128, and then transmitted to the host.

In addition to the regular command pipeline path, the controller 104 in FIG. 1B also includes write history buffer circuitry 111. The write history buffer circuitry 111 causes write commands received within a window of time to be held in a buffer until after the window of time. Each successive write command received within the window of time is stored in the buffer, including over-writing the write data associated with that write address. Read commands to an address held in the buffer are serviced from the buffer rather than sent to the memory. After the window of time has passed, the most recent write command to the address is sent to the memory. The write history buffer circuitry 111 can thus enforce the write-to-write time to the same address to be a predetermined time (e.g., tens or hundreds of microseconds). Therefore, if a host sends write commands to the same address within a short time period, the write commands can be spaced out to reduce the thermal effect on the cells.

Referring to the example in FIG. 1B, the write history buffer circuitry 111 includes buffers 112A and 112B to store write commands and write data for the write commands, respectively. The buffers 112A and 112B include one or more register files or other type of memory or storage to store commands and write data. A command may include information such as source type, source ID, voltage threshold for a memory array, memory region, WRITE command type, address/rank number/partition number, or other command information. In one example, the command buffer 112A includes one register file to store commands, and the data buffer 112B includes a second register file to store the corresponding data. In one example, the buffers 112A and 112B have the same number of entries. In one example, the depth or size of the command buffer 112A and the data buffer 112B depends on the bandwidth of the host. Commands and the corresponding data are held in the buffers 112A and 112B until expiration of the corresponding timers.

Additionally, the write history buffer circuitry 111 of FIG. 1B includes time tracking circuitry 120. In one example, the time tracking circuitry 120 is a collation of timers and base timer. These timers monitor a hold time for each write address. The related timer starts ticking as soon as a write address gets stored in buffer. For example, the time tracking circuitry 120 includes a timer or counter for each entry in the buffers 112A and 112B. For example, consider an example where the write history command buffer 112A has N entries, the write history data buffer 112B includes N entries corresponding to the command buffer's N entries. The time tracking circuitry would also include N entries corresponding to the command buffer's N entries. In one example, a timer is started when a write command is sent to the memory 102 and stored in the buffer 112A. The timer expires after a predetermined time has elapsed. The timer can count from 0 µs to a predetermined time X µs, or down from a predetermined time to 0. The amount of time tracked by the timer can be fixed or programmable. For example, the timer may expire after a predetermined time based on a configuration or mode register.

The write history buffer circuitry 111 also includes an address CAM (content addressable memory) to store addresses corresponding to the commands stored in the write history command buffer 112A. In the illustrated example, the address CAM 116 is a two-port CAM for both read and write commands. The address CAM 116 receives the incoming read or write address and output a signal to indicate whether a matching address is stored in the address CAM. The output signals of the CAM could be a single bit (e.g., logic 0 or 1) or a multi-bit value (e.g., information indicating the location of an address in the address CAM's memory). The address Cam includes the same number of entries (e.g., N) as the write history data buffer 112B, the write history command buffer 112A, and the time tracking circuitry 120. Typically, an address CAM may take a few cycles before outputting the hit signal. Therefore, the shift registers 109 and 105 can delay the read and write commands the same number of clocks as the address CAM delay so that write buffer control logic 118 receives the commands and the output of the address CAM at the same time. Other implementations may omit the shift registers and account for delay in the write buffer control logic 118. In other implementations, a different type of memory other than a CAM may be used to store addresses.

The write history buffer circuitry 111 includes a status table 122 to track status of entries in the CAM and buffer. In one example, the status table 122 includes a register file, or other type of memory or storage for tracking status. In one example, the status table stores status information (e.g., flags or other status information) for each entry in the address CAM and/or buffers. In one example, the status table includes information for each buffer and/or CAM entry, such as: whether the corresponding write command stored in the buffer should be sent to the memory after expiration of the timer (one or more "valid bits"), timer-related flags (e.g., one or more bits indicating whether the timer is running and/or whether the timer has expired for the corresponding entry), and other status information for operation and coherency of the write history buffer circuitry.

The write history buffer circuitry also includes control logic 118 to control operation of the buffers 112A and 112B, the time tracking circuitry 120, and the status table 122. In one example, the control logic 118 includes a finite state machine (FSM) implemented in circuitry (e.g., logic gates, flip flops, etc.). The control logic 118 causes commands that are sent to the memory and corresponding data to be stored in the buffers 112A and 112B. Therefore, write commands are sent not only from the command scheduler 106 to the memory 102, but also to the write command buffer 112A and the write data buffer 112B (e.g., via feedback paths 114). When a write command is sent to the memory 102, a copy of the write command and the data are saved in the buffers 112A and 112B.

The control logic 118 also determines how to handle incoming read and write commands depending on whether the address CAM indicates there is a matching address stored in the CAM 116. When there is a hit from the address CAM 116 for a write command, the control logic 118 causes the write command to be held rather than sent to the memory 102. In one example, the control logic 118 sends a signal to the command pipeline 103 to drop the command and causes the corresponding entries in the buffers 112A and 12B to be overwritten with the new write command and data. When there is a hit from the address CAM 116 for a read command, the control logic 118 causes the read command to be serviced from the write history data buffer 112B. When a timer expires, if subsequent commands to the same address have been received and held in the buffer, the control logic 118 causes the most recent of the subsequent commands to be sent to the memory 102.

Referring to FIG. 1B, consider how commands to the same address are handled with a write history buffer. Specifically, consider how two write commands and a read command to the same address received within a window of time are handled with the write history buffer of FIG. 1B. For example, the command pipeline 103 receives the first write command. The first write command is also received by shift register 109 and the address CAM 116. The address CAM 116 accepts the address of the first write command as input, searches the addresses stored in its memory, and outputs a signal indicating whether there was a "hit" or match. In this example, the address CAM 116 outputs a signal indicating there is no match. The write buffer control logic 118 receives the signal from the address CAM 116 indicating that there is not a match, and therefore allows the first write command to be sent to the memory via the command pipeline 103.

Therefore, the command pipeline 103 sends the first write command to the command scheduler 106. The command scheduler 106 receives the first write command and schedules the first write command for transmission to the memory 102. In response to the first write command being scheduled to the memory 102, a copy of the first write command is stored in the buffers 112A, 112B and the address CAM 116. For example, the write command is stored in entry M of the command buffer 112A, the write data is stored in entry M of the data buffer 112B, and the address is stored in the CAM (either in entry M of the CAM, or stored with information that identifies entry M of the command and data buffers 112A and 112B). The logic for storing a copy of commands sent to memory in the buffers and address CAM can be, for example, in the command scheduler, the write buffer control logic 118, or both. Also in response to the first write command being scheduled to the memory 102 and stored in the buffer, the control logic 118 starts a timer corresponding to the entry of the buffer. For example, the Mth timer corresponding to entry M of the buffers starts counting (e.g., from 0 to a predetermined time X µs).

Consider a second write command received before expiration of the timer (e.g., within X µs) to the same address as the first write command. Like the first write command, the second write command is received by the command pipeline 103, the shift register 109, and the address CAM 116. Because the prior first write command was received and stored in the address CAM 116, the address CAM will output a signal indicating there is an address match. The write buffer control logic 118 receives the output from the address CAM 116 and the write command and data.

In response to determining that there was an address hit from the CAM 116, the control logic 118 causes the second write command to be held instead of being scheduled via the regular command pipeline path. Therefore, the control logic 118 sends a signal to the command pipeline 103 to drop (not send to the scheduler) the second write command from the pipeline. Sending a signal to drop a command can involve, for example, sending an invalid flag to the pipeline for the command. The control logic 118 stores the second command and data in the buffers 112A and 112B. Because there is already an entry in the address CAM 116 for the address, the corresponding entry of the write history data buffer 112B is overwritten with the new write data. For example, the entry M of the command and data buffers 112A and 112B are overwritten with the second command and second write data. In response to receiving a hit from the address CAM 116 for a write command, a valid bit may also be set in the status table 122 to indicate that a command is being held in the buffer. Prior to expiration of the timer, the second command is not sent to the memory. If additional (third, fourth, etc.) write commands are received to the same address before expiration of the timer, the buffer entry corresponding to that address is overwritten with write data for each corresponding write command received prior to expiration of the timer. Once the timer expires, the control logic 118 causes the second command (or most recent command to the address if additional write commands to that address were received) to be sent to the scheduler 106 via the paths 121 and 123 for scheduling and transmission to the memory 102. In one such example, in response to scheduling the second write command, the valid bit corresponding to the command is cleared and the address in the address CAM 116 is reset. A copy of the second command is then stored in the buffer and a corresponding timer started.

Consider an example in which a read command to the same address is received by the memory device 100. Similar to the write commands, the read command is received by the command pipeline 103, the shift register 105, and the address CAM 116. The address CAM 116 compares the incoming address to addresses stored in the memory of the address CAM 116. If the incoming address is already stored in the address CAM (a hit), that is an indication that there was a prior write command to that address, which caused the address to be stored in the address CAM 116. The address CAM 116 outputs a signal to the control logic 118 indicating there is an address match. In one example, the output signal from the CAM 116 identifies which entry of the data buffer 112B correspond to the address. The control logic 118 then sends a signal to the command pipeline 103 to drop the command, and instead causes the read data to be retrieved from the write history data buffer 112A. The buffer read data is sent from the buffer 112A to the read data processing logic 128 via path 131. The read data processing logic 128 processes the read data and sends it to the host.

Now consider an example where only one write command is sent to a particular address within the window of time (no consecutive write commands to the same address). In one such example, after the timer expires (e.g., after X μs), the address is cleared from or invalidated in the address CAM 116 and no commands are sent to the memory 102 because the one write command to the address would have already been sent.

Thus, if a host hammers a location by writing continuously to the same address, the commands are coalesced together in the write history buffer. Then, after the time window, the write command and the most recent data are sent to the memory. In this example, for any number of writes that are received within the window of time, there will be only one write command issued to the memory.

Figure 2:
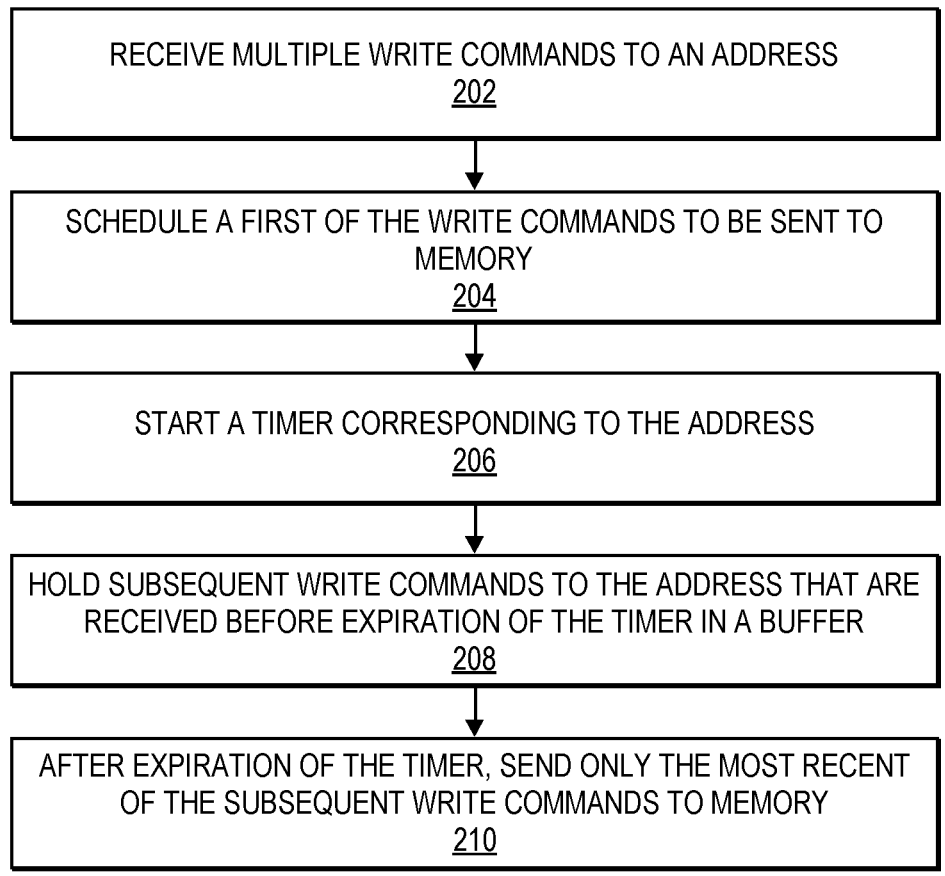
FIG. 2 is a flow diagram of an exemplary method performed at a memory device with a write history buffer.
Figure 3:
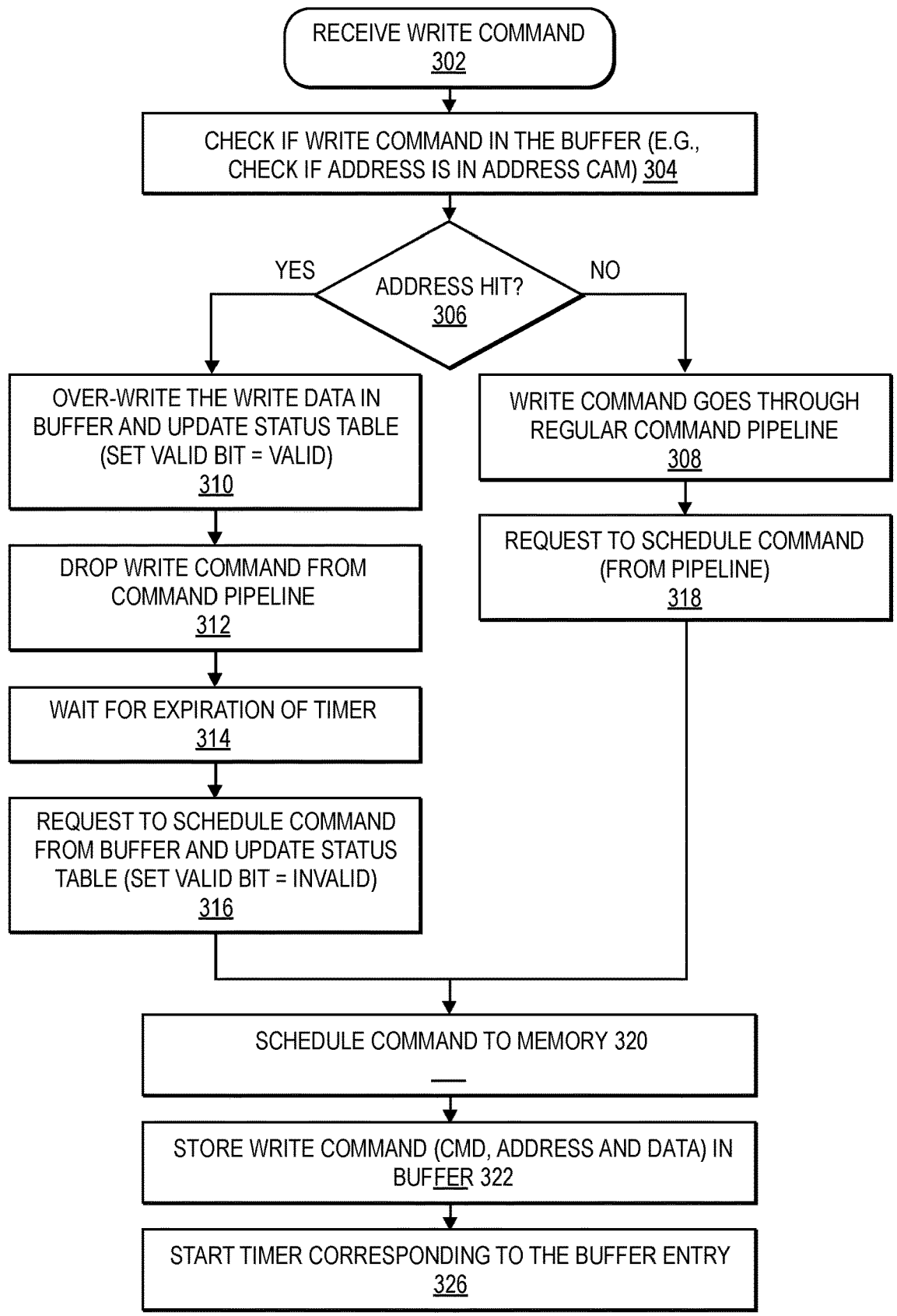
FIG. 3 is a flow diagram of an exemplary method of handling a write command at a memory device with a write history buffer.
Figure 4:
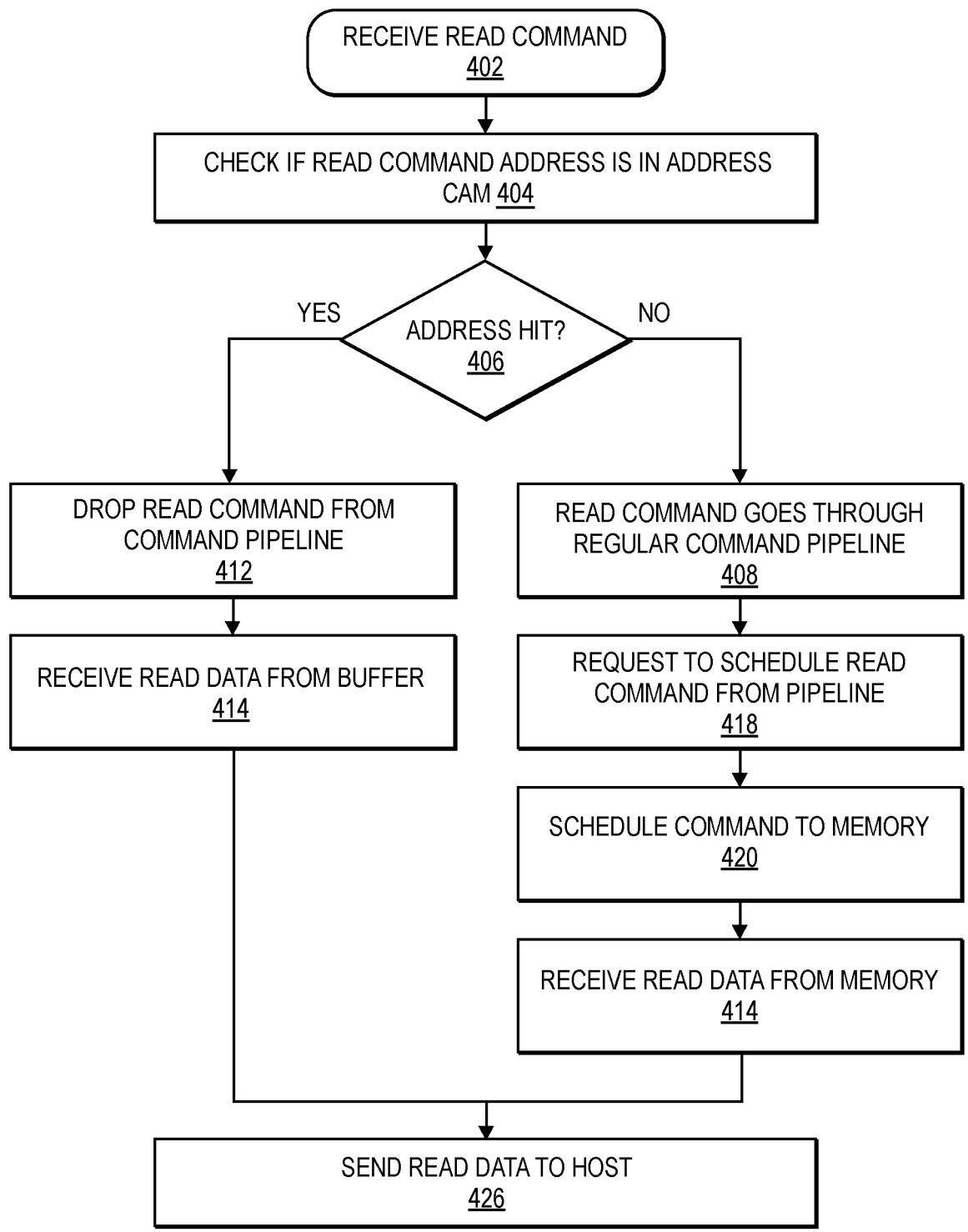
FIG. 4 is a flow diagram of an exemplary method of handling a read command at a memory device with a write history buffer.

FIGS. 2-4 are flow diagrams of exemplary methods to be performed at a memory device with a write history buffer. The methods of FIGS. 2-4 can be performed by hardware logic (e.g., circuitry) on a same die, package, or module as the memory. For example, referring to FIG. 1B, the method of FIGS. 2-4 can be performed by one or more circuits of the controller 104.

FIG. 2 is a flow diagram of an exemplary method performed at a memory device with a write history buffer. The method of FIG. 2 starts with receiving multiple write commands to the same address, at 202. For example, referring to FIG. 1B, the I/O interface circuitry 113 receives multiple write commands from a host. The first write command received to a particular address is scheduled to be sent to the memory, at 204. For example, referring to FIG. 1B, the first write command is sent from the command pipeline 103 to the command scheduler 106, which schedules the command to be sent to the memory 102. The first write command is stored in the write history buffer (e.g., the buffers 112A and 112B and the CAM 116 of FIG. 1B). A timer is started corresponding to that address, at 206. For example, a timer in the time tracking circuitry 120 that corresponds to the entry in the command buffer 112A starts counting.

Subsequent write commands to the same address that are received before expiration of the timer are stored in a buffer, at 208. For example, referring to FIG. 1B, subsequent write commands to the same address are stored by the control logic 118 in the command buffer 112A. The control logic overwrites write data corresponding to the address in the data buffer 112B with write data for the subsequent write command. After expiration of the timer, only the most recent of the subsequent write commands to that address is sent to memory, at 210. For example, referring to FIG. 1B, the command scheduler receives the most recent subsequent command from the command buffer 112A and the corresponding data from the data buffer 112B, and sends the command to the memory 102. Thus, if a subsequent write command to the same address is received within a window of time after the first write command to that address, the subsequent write command will be stored in the write history buffer and not sent directly to the memory. After the window of time (marked by expiration of the timer), the command will be scheduled from the write history buffer.

FIG. 3 is a flow diagram of a specific example of a method of handling a write command at a memory device with a write history buffer. For each write command received at the memory device, 302, the method involves checking if the command address is stored in the buffer, at 304. If there is no address hit, 306 NO branch, the write command goes through the regular command pipeline 308. The command is requested to be scheduled, at 318.

If there is an address hit, 306 YES branch, the data in the buffer entry corresponding to the address is over-written with the new write data, at 310. In one example, status information corresponding to the entries in the buffer and/or CAM are updated, at 310. For example, one or more bits can be set to a value to indicate that new write data is stored in the buffer and should be sent to the memory after expiration of the timer. The write command is being held in the buffer, and is dropped from the command pipeline, 312. After expiration of the timer, 314, the write command and data stored in the buffer are requested to be scheduled for transmission to the memory, at 316. In one example, after requesting to schedule the command, the status information is updated to indicate that the entry is no longer valid, at 316. Commands that are then scheduled to be sent to the memory, at 320. The write command and write data sent to memory are then stored in the buffer, 322. The write command, address, and data may be stored in the same or a different entry. A timer corresponding to the entry is then started, 326. The method repeats the method starting at 302 for each received write command.

FIG. 4 is a flow diagram of an exemplary method of handling a read command at a memory device with a write history buffer. For each read command received at 402, the method involves checking if the read command address is stored in the buffer (e.g., via a CAM), at 404. If there is an address hit, 406 YES branch, the read command is dropped from the command pipeline 412. The read data is received from the buffer, at 414. The read data can then be sent to the host, 426. Thus, the write history buffer can serve as a cache in addition to enforcing a particular spacing of write commands sent to the memory.

If there is not an address hit, 406 NO branch, the read command goes through the regular command pipeline, at 408. The read command is then requested to be scheduled from the pipeline, at 418, scheduled to the memory, at 420. The read data is received from the memory, at 414. The read data can then be sent to the host, at 426.

Thus, a write history buffer as described herein can enable a guaranteed write-to-write spacing for commands going to the same addresses, which can relax the refresh rate for write disturb prevention without needing to limit the write bandwidth (BW).

Figure 5:
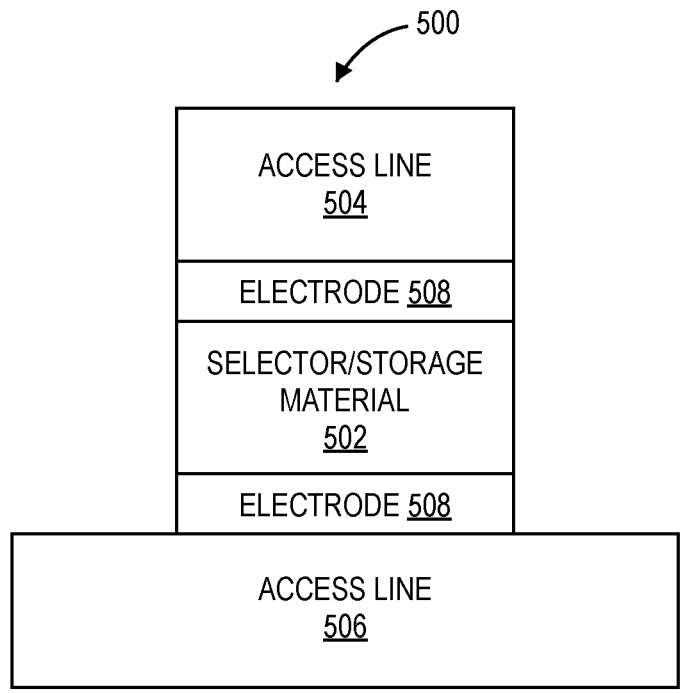
FIG. 5 is an example of a cross-point memory cell.

The techniques and circuitry discussed herein can apply to various memory technologies. A crosspoint memory device is one example in which a write history buffer may be implemented. FIG. 5 illustrates an example of a cross-point memory cell. FIG. 5 illustrates a memory cell 500. The memory cell 500 includes one or more layers of material 502 to store data and aid in selection of the memory cell 500. For example, the memory cell 500 can include a storage material 502 (e.g., to form a memory element), a selector material (e.g., to form the switch element), or both, between access lines 504 and 506. In one example, the memory cell includes a layer of storage material and a separate layer of selector material. In one example, both the selector and the storage element have tunable threshold voltages. In one example, the memory cell 500 includes a self-selecting material that exhibits both memory and selection effects. A self-selecting material is a storage material that enables selection of a memory cell in an array without requiring a separate layer of material for selection of the cell. In one example, a self-selecting memory cell includes a single layer of material that acts as both a selector element to select the memory cell and a memory element to store a logic state. A material exhibits memory effects if the material can be put in one of multiple (e.g., 2 or more) stable states (e.g., via a write operation), and subsequently read back (e.g., via a read operation). In one example, the switch element formed from the select material is an ovonic switch. The techniques described herein are not dependent on or specific to a particular storage material. However, some non-limiting examples of storage material follow.

In some examples, the storage material is a phase change material. In other examples, the storage material can be in one or multiple stable states without a change in phase. In one example, the memory element, switching element, or both are amorphous semiconductor threshold switches (e.g., ovonic threshold switches) using an amorphous material such as an amorphous chalcogenide material or other amorphous material. An ovonic threshold switch remains in an amorphous state which distinguishes it from an ovonic memory, which generally changes between amorphous and crystalline states. In one example, an ovonic memory is used in series with an ovonic threshold switch. In such case, the ovonic threshold switch operates as the switch element for the ovonic memory. Whether the memory material of the memory cell changes phase or not, in one example, the memory could be referred to as a resistance-based memory.

In a resistance-based memory, the bit stored by a memory cell is based on the resistive state of the memory cell.

Examples of storage material can include one or more of: tellurium (Te), selenium (Se), germanium (Ge), antimony (Sb), bismuth (Bi), lead (Pb), tin (Sn), indium (In), silver (Ag), arsenic (As), sulfur (S), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta) or other materials. For example, the storage material may include one or more chalcogenide materials such as such as Te—Se, Ge—Te, In—Se, Sb—Te, Ge—Sb, Ta—Sb—Te, Ga—Sb, In—Sb, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, Sn—Sb—Bi, In—Sb—Ge, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, Se—As—Ge—Si—In, or other materials capable of being programmed to one of multiple states. One or more elements in a chalcogenide material may be dopants. For example, the storage material may include dopants such as: aluminum (Al), oxygen (O), nitrogen (N), silicon (Si), carbon (C), boron (B), zirconium (Zr), hafnium (Hf), or a combination thereof. The storage material may include other materials or dopants not explicitly listed.

As mentioned above, some memory cells include a separate layer of selector material to form a switch element. The selector material may include a chalcogenide material (e.g., a chalcogenide glass) or other material capable of operating as a selection element. In one example, the selector material includes one or more of: silicon (Si), germanium (Ge), selenium (Se), arsenic (As), tellurium (Te), or other materials. In one example, the selector material includes Si—Ge—As—Se, As—Ge—Te—Si, or other selector material. The selector material may also include dopants such as: aluminum (Al), oxygen (O), nitrogen (N), silicon (Si), carbon (C), boron (B), zirconium (Zr), hafnium (Hf), or a combination thereof. The selector material may include other materials or dopants not explicitly listed.

The access lines 504, 506 electrically couple the memory cell 500 with circuitry that provides power to and enables access to the memory cell 500. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data. The access lines 504, 506 can be referred to as a bit line and word line, respectively. The word line is for accessing a particular word in a memory array and the bit line is for accessing a particular bit in the word. The access lines 504, 506 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one example, electrodes 508 are disposed between storage material 502 and access lines 504, 506. Electrodes 508 electrically couple access lines 504, 506 with storage material 502. A memory cell with separate layers of storage and selector material may also include an electrode between the layers of storage and selector material. Electrodes 508 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Figure 6:
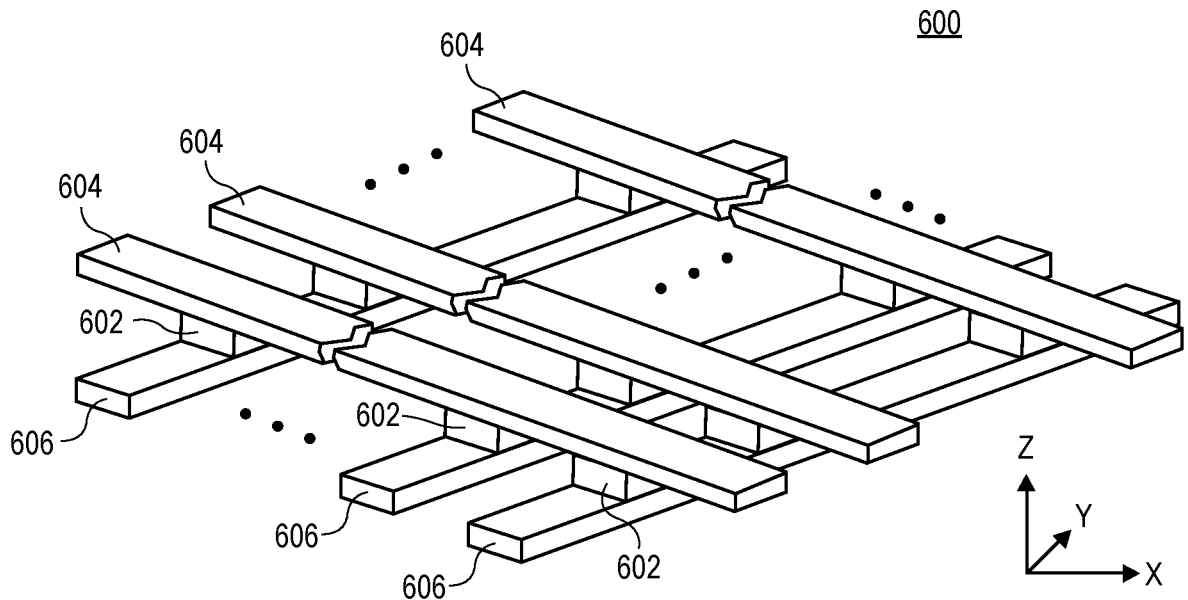
FIG. 6 illustrates an example of a portion of a memory cell array.

FIG. 6 illustrates a portion of a memory cell array 600, which can include a memory cell such as the memory cell 500 of FIG. 5. The memory cell array 600 is an example of a crosspoint memory array. The memory cell array 600 includes a plurality of access lines 604, 606, which can be the same or similar as the access lines 504, 506 described with respect to FIG. 5. Access lines 604, 606 can be referred to as bit lines and word lines. In the example illustrated in FIG. 6, the bit lines (e.g., access lines 604) are orthogonal to the word lines (e.g., access lines 606). A storage material 602 is disposed between the access lines 604, 606. In one example, a "crosspoint" is formed at an intersection between a bit line and a word line. A memory cell is created from the storage material 602 between the bit line and word line where the bit line and word line intersect. The storage material 602 can be a chalcogenide material, phase change material, both a chalcogenide material and phase change material, or other storage material. In one example, the access lines 604, 606 are composed of one or more conductive materials such as the access lines 504, 506 described above with respect to FIG. 5.

Although a single level or tier of memory cells is shown in FIG. 6 for the sake of clarity, memory cell array 600 typically includes multiple levels, decks, or tiers of non-volatile memory cells (e.g., in the z-direction). Nonvolatile memory devices including multiple tiers of cross-point memory cells may be referred to as three-dimensional (3D), multi-level, or multi-tiered cross-point memory devices. The techniques discussed herein may also apply to other persistent memory types or crosspoint memory architectures (e.g., vertical crosspoint memory in which cells are formed along and around conductive channels). The FIGS. 5 and 6 illustrate examples of a crosspoint memory cell and array that may be accessed with control circuitry including a write history buffer. However, the techniques described herein can be implemented for memories having different materials or structures than the examples described in FIGS. 5 and 6.

Figure 7:
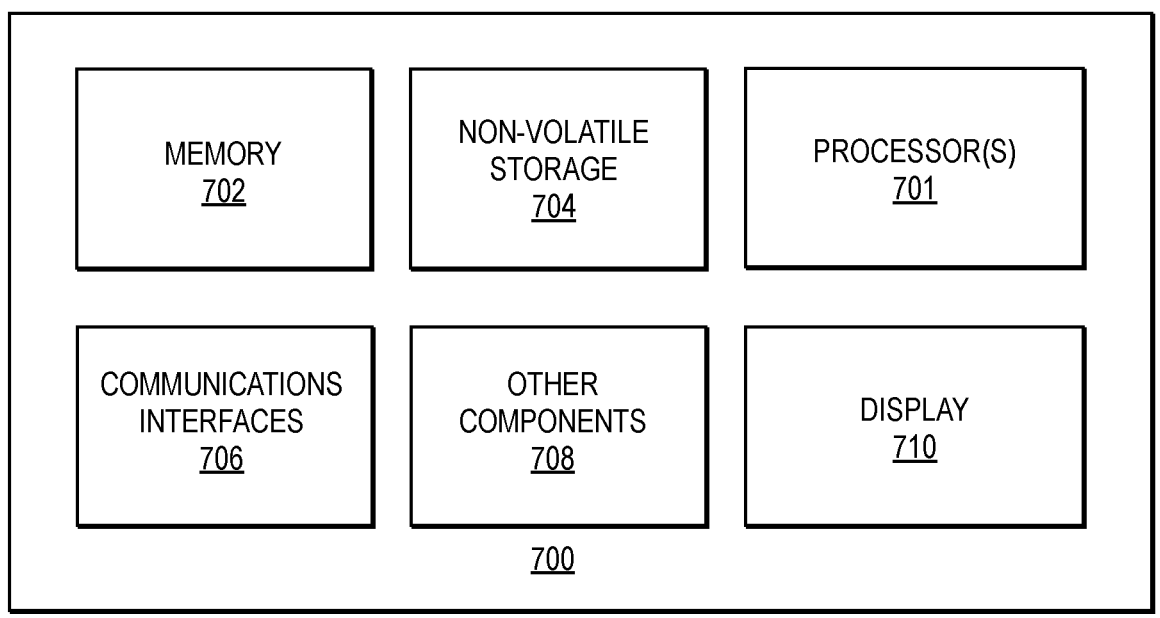
FIG. 7 provides an exemplary depiction of a computing system in which a write history buffer may be implemented.

FIG. 7 provides an exemplary depiction of a computing system 700 (e.g., a smartphone, a tablet computer, a laptop computer, a desktop computer, a server computer, etc.). As observed in FIG. 7, the system 700 may include one or more processors or processing units 701. The processor(s) 701 may include one or more central processing units (CPUs), each of which may include, e.g., a plurality of general-purpose processing cores. The processor(s) 701 may also or alternatively include one or more graphics processing units (GPUs) or other processing units. The processor(s) 701 may include and/or be coupled with a memory controller. The processor(s) 701 can be similar to, or the same as, the processor 101 of FIG. 1A.

The system 700 also includes memory 702 (e.g., system memory), non-volatile storage 704, communications interfaces 706, a display 710 (e.g., touchscreen, flat-panel), and other components 708. The memory 702 may implement a write history buffer in accordance with examples described herein. The other components may include, for example, a power supply (e.g., a battery or/or other power supply), sensors, power management logic, or other components. The communications interfaces 706 may include logic and/or features to support a communication interface. For these examples, communications interface 706 may include one or more communication or network interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 704, which may be the mass storage component of the system. The non-volatile storage 704 can be similar to, or the same as, the memory device 100 of FIG. 1A, described above. Non-volatile storage 704 may include byte or block addressable types of non-volatile memory having a crosspoint memory structure. Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 704 may include mass storage that is composed of one or more SSDs (solid state drives), DIMMs (dual in line memory modules), or other module or drive. The non-volatile storage 704 may implement a write history buffer in accordance with examples described herein.

Examples of techniques using a write history buffer to cause consecutive write commands to the same address to be spaced by an amount of time follow.

Example 1

A memory device includes a crosspoint memory array and hardware logic coupled with the crosspoint memory array.

The hardware logic to receive multiple write commands to an address, send a first of the write commands to the crosspoint memory array and start a timer, hold subsequent write commands to the address received after the first of the write commands and before expiration of the timer in a buffer, and after expiration of the timer, send a most recent of the subsequent write commands to the crosspoint memory array.

Example 2

The memory device of example 1, wherein the hardware logic is to: in response to scheduling the first of the write commands to be sent to the crosspoint memory: store command data and write data for the first of the write commands in the buffer and store the address in an address CAM (content addressable memory).

Example 3

The memory device of one of example 1 or 2, wherein the hardware logic to store subsequent write commands in the buffer is to: for each of the subsequent write commands to the address received before expiration of the timer, overwrite write data corresponding to the address in the buffer with write data for the subsequent write command, and send a signal to a command pipe to drop the subsequent write command.

Example 4

The memory device of one of example 1, 2, or 3, wherein the hardware logic is to: for each of the multiple write commands received, determine whether a prior write command to the address is stored in the buffer.

Example 5

The memory device of one of examples 1, 2, 3, and 4, wherein the hardware logic to determine whether a prior write command to the address is stored in the buffer includes an address CAM (content addressable memory) to receive the address and output a signal to indicate whether a matching address is stored in the address CAM.

Example 6

The memory device of one of examples 1, 2, 3, 4, and 5, wherein the hardware logic is to: for each of the multiple write commands received, if the matching address is not stored in the address CAM, send the write command to the crosspoint memory array, and start a timer corresponding to the address.

Example 7

The memory device of one of examples 1, 2, 3, 4, 5, and 6, wherein the hardware logic includes a timer for each entry in the buffer, the timer to start in response to scheduling of a write command to the crosspoint memory.

Example 8

The memory device of one of examples 1, 2, 3, 4, 5, 6, and 7, wherein the hardware logic is to receive a read command to the address, determine whether the address is stored in the buffer, if the read address is stored in the buffer, retrieve read data from the buffer, and if the read address is not stored in the buffer, send the read command to the crosspoint memory.

Example 9

The memory device of one of examples 1-8, wherein the hardware logic to determine whether the address is stored in the buffer includes an address CAM (content addressable memory) to receive the address and output a signal to indicate whether a matching address is stored in the address CAM.

Example 10

The memory device of one of examples 1-9, further including the buffer, the buffer including a register file to store commands and a second register file to store data corresponding to the commands.

Example 11

Circuitry including: input/output (I/O) interface circuitry to receive multiple write commands to an address of a crosspoint memory array, and command pipeline circuitry to send a first of the write commands to the crosspoint memory array, control circuitry to: hold subsequent write commands to the address received after the first of the write commands and before expiration of the timer in a buffer, and after expiration of the timer, send a most recent of the subsequent write commands to the crosspoint memory array.

Example 12

The circuitry of example 11, wherein the control circuitry is to: in response to scheduling the first of the write commands to be sent to the crosspoint memory, store command data and write data for the first of the write commands in the buffer and store the address in an address CAM (content addressable memory).

Example 13

The circuitry of one of examples 11 and 12, wherein the control circuitry to store subsequent write commands in the buffer is to: for each of the subsequent write commands to the address received before expiration of the timer, overwrite write data corresponding to the address in the buffer with write data for the subsequent write command, and send a signal to a command pipe to drop the subsequent write command.

Example 14

The circuitry of one of examples 11-13, wherein the control circuitry is to: for each of the multiple write commands received, determine whether a prior write command to the address is stored in the buffer.

Example 15

The circuitry of one of examples 11-14, wherein the control circuitry to determine whether a prior write command to the address is stored in the buffer includes: an address CAM (content addressable memory) to receive the address and output a signal to indicate whether a matching address is stored in the address CAM.

Example 16

The circuitry of one of examples 1-15, wherein the control circuitry is to: for each of the multiple write commands received, if the address for the write command is not stored in the buffer, send the write command to the crosspoint memory array, and start a timer corresponding to the address.

Example 17

The circuitry of one of examples 11-16, further including a timer for each entry in the buffer, the timer to start in response to transmission of a write command to the crosspoint memory.

Example 18

The circuitry of one of examples 11-17, wherein the I/O interface circuitry is to receive a read command to the address, determine whether the address is stored in the buffer, if stored in the buffer, retrieve read data from the buffer, and if the read address is not stored in the buffer, send the read command to the crosspoint memory.

Example 19

A system including a memory controller, and a memory device coupled with the memory controller, the memory device including a crosspoint memory array, and hardware logic coupled with the crosspoint memory array, the hardware logic to: receive multiple write commands to an address, send a first of the write commands to the crosspoint memory array and start a timer, hold subsequent write commands to the address received after the first of the write commands and before expiration of the timer in a buffer, and after expiration of the timer, send only a most recent of the subsequent write commands to the crosspoint memory array.

Example 20

The system of example 19, further including one or more of: a processor coupled with the memory controller, a display coupled with a processor, a network interface coupled with a host processor, and a battery to power the system.

Example 21

The system of example 19 or 20, wherein the memory device is in accordance with an of examples 1-10.

Example 22

A method implemented in a memory device, the method involving receiving multiple write commands to an address, scheduling a first of the write commands to be sent to the crosspoint memory array, in response to scheduling the first of the write commands, starting a timer corresponding to the address, holding subsequent write commands to the address received after the first of the write commands and before expiration of the timer in a buffer; and after expiration of the timer, sending only a most recent of the subsequent write commands to the crosspoint memory array.

Example 23

The method of one of examples 21 or 22, further including: in response to scheduling the first of the write commands to be sent to the crosspoint memory, storing the address and write data for the first of the write commands in the buffer.

Example 24

The method of one of examples 21-23, further including: for each of the subsequent write commands to the address received before expiration of the timer: overwriting write data corresponding to the address in the buffer with write data for the subsequent write command and sending a signal to a command pipe to drop the subsequent write command.

Example 25

The method of one of examples 21-24, further including: for each of the multiple write commands received: determining whether a prior write command to the address is stored in the buffer

Example 26

The method of one of examples 21-25, wherein determining whether a prior write command to the address is stored in the buffer includes searching for the address in an address CAM (content addressable memory).

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
a crosspoint memory array; and
hardware logic coupled with the crosspoint memory array, the hardware logic to:
receive multiple write commands to an address, including a first write command to the address and subsequent write commands to the address,
send the first write command to the crosspoint memory array and start a timer,
for each of the subsequent write commands to the address received before expiration of the timer, hold the subsequent write command in a buffer, including overwriting write data corresponding to the address in the buffer with write data for the subsequent write command, and
after expiration of the timer, send only a most recent of the subsequent write commands to the crosspoint memory array.

2. The memory device of claim 1, wherein:
the hardware logic is to:
in response to scheduling the first of the write commands to be sent to the crosspoint memory:
store command data and write data for the first of the write commands in the buffer, and
store the address in an address CAM (content addressable memory).

3. The memory device of claim 1, wherein:
the hardware logic to store subsequent write commands in the buffer is to:
for each of the subsequent write commands to the address received before expiration of the timer:
send a signal to a command pipe to drop the subsequent write command.

4. The memory device of claim 1, wherein:
the hardware logic is to:
for each of the multiple write commands received:
determine whether a prior write command to the address is stored in the buffer.

5. The memory device of claim 4, wherein the hardware logic to determine whether a prior write command to the address is stored in the buffer includes:
an address CAM (content addressable memory) to receive the address and output a signal to indicate whether a matching address is stored in the address CAM.

6. The memory device of claim 5, wherein:
the hardware logic is to:
for each of the multiple write commands received:
if the matching address is not stored in the address CAM, send the write command to the crosspoint memory array, and start a timer corresponding to the address.

7. The memory device of claim 1, wherein:
the hardware logic includes:
a timer for each entry in the buffer, the timer to start in response to scheduling of a write command to the crosspoint memory array.

8. The memory device of claim 1, wherein:
the hardware logic is to:
receive a read command to the address;
determine whether the address is stored in the buffer;
if the address is stored in the buffer, retrieve read data from the buffer; and
if the address is not stored in the buffer, send the read command to the crosspoint memory.

9. The memory device of claim 8, wherein:
the hardware logic to determine whether the address is stored in the buffer includes:
an address CAM (content addressable memory) to receive the address and output a signal to indicate whether a matching address is stored in the address CAM.

10. The memory device of claim 1, further comprising:
the buffer, the buffer including a register file to store commands and a second register file to store write data corresponding to the commands.

11. Circuitry comprising:
input/output (I/O) interface circuitry to receive multiple write commands to an address of a crosspoint memory array, the multiple write commands including a first write command to the address and subsequent write commands to the address;
command pipeline circuitry to send the first write command to the crosspoint memory array; and
control circuitry to:
start a timer in response to scheduling the first write command to the crosspoint memory array,
for each of the subsequent write commands to the address received before expiration of the timer, hold the subsequent write command in a buffer, including overwriting write data corresponding to the address in the buffer with write data for the subsequent write command, and
after expiration of the timer, send only a most recent of the subsequent write commands to the crosspoint memory array.

12. The circuitry of claim 11, wherein:
the control circuitry is to:
in response to scheduling the first of the write commands to be sent to the crosspoint memory:
store command data and write data for the first of the write commands in the buffer, and
store the address in an address CAM (content addressable memory).

13. The circuitry of claim 11, wherein:
the control circuitry to store subsequent write commands in the buffer is to:
for each of the subsequent write commands to the address received before expiration of the timer:
send a signal to a command pipe to drop the subsequent write command.

14. The circuitry of claim 11, wherein:
the control circuitry is to:
for each of the multiple write commands received:
determine whether a prior write command to the address is stored in the buffer.

15. The circuitry of claim 14, wherein the control circuitry to determine whether a prior write command to the address is stored in the buffer includes:
an address CAM (content addressable memory) to receive the address and output a signal to indicate whether a matching address is stored in the address CAM.

16. The circuitry of claim 15, wherein:
the control circuitry is to:
for each of the multiple write commands received:
if the matching address is not stored in the address CAM, send the write command to the crosspoint memory array, and start a timer corresponding to the address.

17. The circuitry of claim 11, further comprising:
a timer for each entry in the buffer, the timer to start in response to scheduling of a write command to the crosspoint memory array.

18. The circuitry of claim 11, wherein:
the I/O interface circuitry is to:
receive a read command to the address;
determine whether the address is stored in the buffer;
if the address is stored in the buffer, retrieve read data from the buffer; and
if the address is not stored in the buffer, send the read command to the crosspoint memory.

19. A system comprising:
a memory controller; and
a memory device coupled with the memory controller, the memory device comprising:
a crosspoint memory array; and
hardware logic coupled with the crosspoint memory array, the hardware logic to:
receive multiple write commands to an address, including a first write command to the address and subsequent write commands to the address,
send the first write command to the crosspoint memory array and start a timer,
for each of the subsequent write commands to the address received before expiration of the timer, hold the subsequent write command in a buffer, including overwriting write data corresponding to the address in the buffer with write data for the subsequent write command, and
after expiration of the timer, send only a most recent of the subsequent write commands to the crosspoint memory array.

20. The system of claim 19, further comprising one or more of:
a processor coupled with the memory controller, a display coupled with a processor, a network interface coupled with a host processor, and a battery to power the system.

* * * * *